United States Patent
Shin

(10) Patent No.: US 6,921,628 B2
(45) Date of Patent: Jul. 26, 2005

(54) EXPOSURE DEVICE AND METHOD OF FABRICATING LIQUID CRYSTAL DISPLAY PANEL USING THE SAME

(75) Inventor: Joong Sup Shin, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/281,986

(22) Filed: Oct. 29, 2002

(65) Prior Publication Data

US 2003/0091939 A1 May 15, 2003

(30) Foreign Application Priority Data

Nov. 15, 2001 (KR) .......................................... 2001-71134

(51) Int. Cl.[7] .................................................. G03F 7/20
(52) U.S. Cl. ....................... 430/319; 430/321; 430/396; 355/53; 355/76
(58) Field of Search ................................. 430/319, 321, 430/396, 5; 355/53, 77, 76; 438/30

(56) References Cited

U.S. PATENT DOCUMENTS

2001/0009455 A1 * 7/2001 Nishimura et al. ............ 355/72

* cited by examiner

*Primary Examiner*—John A. McPherson
(74) *Attorney, Agent, or Firm*—Morgan, Lewis & Bockius LLP

(57) ABSTRACT

An exposure device includes a light irradiator for irradiating light, a mask having a pattern to be formed on a substrate, the mask having a size larger than at least two display panel areas positioned on the substrate, and at least two vacuum pads positioned along sides of the mask for affixing the mask over the substrate.

14 Claims, 4 Drawing Sheets

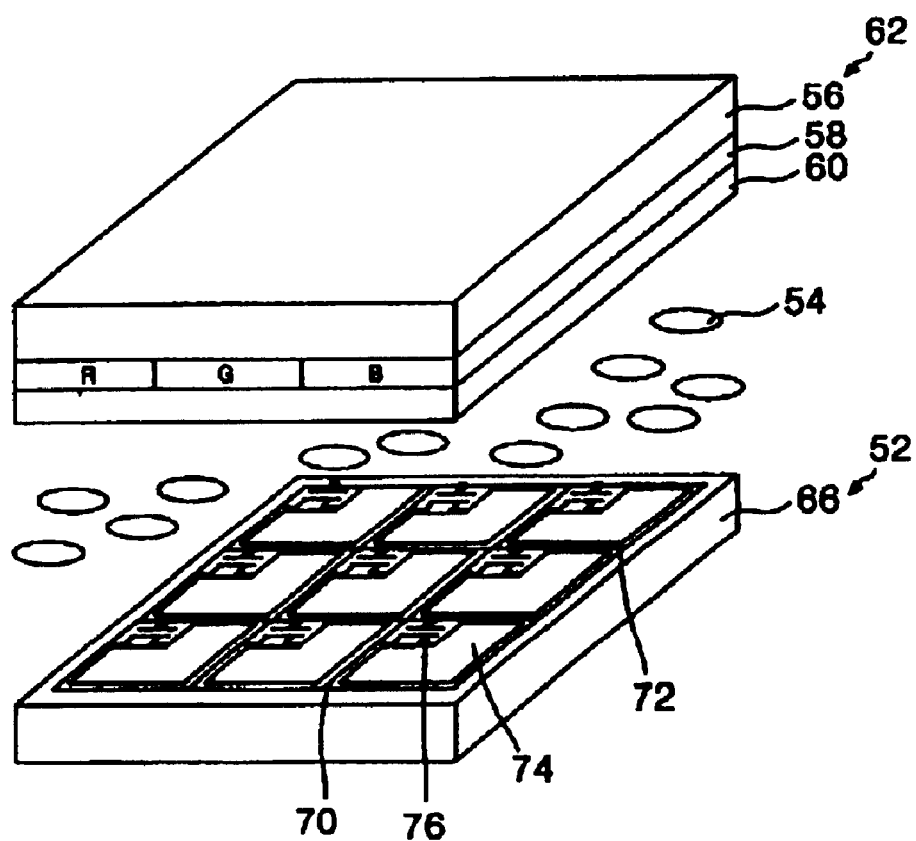

US 6,921,628 B2

EXPOSURE DEVICE AND METHOD OF FABRICATING LIQUID CRYSTAL DISPLAY PANEL USING THE SAME

The present invention claims the benefit of Korean Patent Application No. P2001-71134 filed in Korea on Nov. 15, 2001, which is hereby incorporated by reference.

BACKGROUND OF THE INVENTION

1. Field of the Invention

This invention relates to an exposure device, and more particularly to an exposure device and a method of fabricating a liquid crystal display panel using the same that reduces scanning frequency and improves panel production.

2. Description of the Related Art

In general, during photolithographic processes, a substance resistant to chemical etching is deposited onto a substrate or a wafer to form a photoresist layer. Then, light is irradiated onto a patterned mask that is provided above a surface of the substrate to transfer the pattern onto the surface of the substrate. During the photolithographic processes, light is irradiated onto the mask to transfer the pattern onto the substrate or wafer using an exposure device, thereby completing an exposure step.

FIG. 1 is a plan view of an exposure device according to the related art, and FIG. 2 is a cross sectional view of the exposure device along I–I' of FIG. 1 according to the related art. In FIGS. 1 and 2, a mask stage part includes a mask 2 having a chrome pattern 16 formed thereon, and a vacuum pad 4 formed at each side of the mask 2. The pattern 16 is formed on the substrate 12 by irradiating light onto the mask 2. A pellicle 18 is positioned adjacent to the chrome pattern 16 with a specific gap formed therebetween, and a frame 14 is formed at both sides of the pellicle 18 for supporting the pellicle 18.

In FIGS. 1 and 2, an X-blade 10X and a Y-blade 10Y are positioned under the frame 14 and the vacuum pad 4 of the mask 2 prevents the light from being transmitted to areas other than the pellicle 18. The vacuum pad 4 absorbs side portions of the mask 2 with an absorber 8, and supports the mask 2 to be positioned over the substrate 12. The vacuum pads 4 are formed along each side of the mask 2 and are interconnected to each another through a vacuum line 6.

FIG. 3 is a plan view of an exposure order and exposure direction of the substrate of FIG. 2 according to the related art. In FIG. 3, the length of a shorter side of the substrate 12 located under the mask 2 is about 590 mm, and the length of a longer side of the substrate 12 located under the mask 2 is about 670 mm. In addition, the pattern on the substrate 12 is formed within a cell process key CPK that is about 576 ±2 mm, and an inspection pattern is formed along an outer area of the substrate 12 from the CPK.

If the substrate 12 included six liquid crystal display panel areas 201–206, a maximum exposure area of the exposure would be about 560 mm (in FIG. 2). However, the required exposure area of the exposure is about 576 mm for scanning and exposing the two liquid crystal display panel areas formed on the substrate 12. Thus, the two liquid crystal display panel areas cannot be scanned and exposed with a single mask 2 during one exposure. Accordingly, the exposure has to individually scan and expose each of the six liquid crystal display panel areas 201–206 formed on the substrate 12, thereby decreasing yield and increasing processing time. One proposed solution includes enlarging the frame 14 of the mask 2 to reduce the scanning frequency. However, the mask stage part is in contact with the frame 14 of the mask 2, thereby making loading problematic.

When scanning and exposing the six liquid crystal display panel areas 201–206 formed on the substrate 12 using the exposure, the $n^{th}$ liquid crystal display panel area is scanned along an opposite direction to the $(n+1)^{th}$ liquid crystal display panel area, thereby reducing a total exposure time. For example, the first liquid crystal display panel area 201 is scanned and exposed while the mask stage part moves downwards, and the second liquid crystal display panel area 202 is scanned and exposed while the mask stage part moves upwards. Similarly, the third to sixth liquid crystal display panel areas 203–206 are also scanned and exposed while the mask stage part alternately moves upwards and downwards. As a result, the first to sixth liquid crystal display panel areas 201–206 are alternately scanned upwards and downwards to be exposed and the first to sixth liquid crystal display panel areas 201–206 are scanned along the same direction to be exposed, thereby reducing total exposure time.

However, a significant decrease in picture quality often occurs in the second, fourth, and sixth liquid crystal display panel areas 202, 204, and 206, where the mask stage part moves upwards for scanning and exposing them. In addition, because the scanning directions of the adjacent liquid crystal display panel areas 201–206 are different from each other, alignment between the mask 2 and the substrate 12 should be performed a total 6 times, thereby increasing a total exposure time.

SUMMARY OF THE INVENTION

Accordingly, the present invention is directed to an exposure device and method of fabricating a liquid crystal display panel using the exposure device that substantially obviates one or more of the problems due to limitations and disadvantages of the related art.

An object of the present invention is to provide an exposure device and a method of fabricating a liquid crystal display panel using an exposure device that reduces scanning frequency, thereby increasing production yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an exposure device includes a light irradiator for irradiating light, a mask having a pattern to be formed on a substrate, the mask having a size bigger than at least two display panel areas positioned on the substrate, and at least two vacuum pads positioned along sides of the mask for affixing the mask over the substrate.

In another aspect, a method of fabricating a liquid crystal display panel using an exposure device includes providing a substrate having at least two adjacent display panel areas, and forming a pattern simultaneously on the two adjacent display panel areas along an exposure direction of the exposure device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 7 is a perspective view of an exemplary liquid crystal display panel fabricated using the exemplary exposure device according to the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
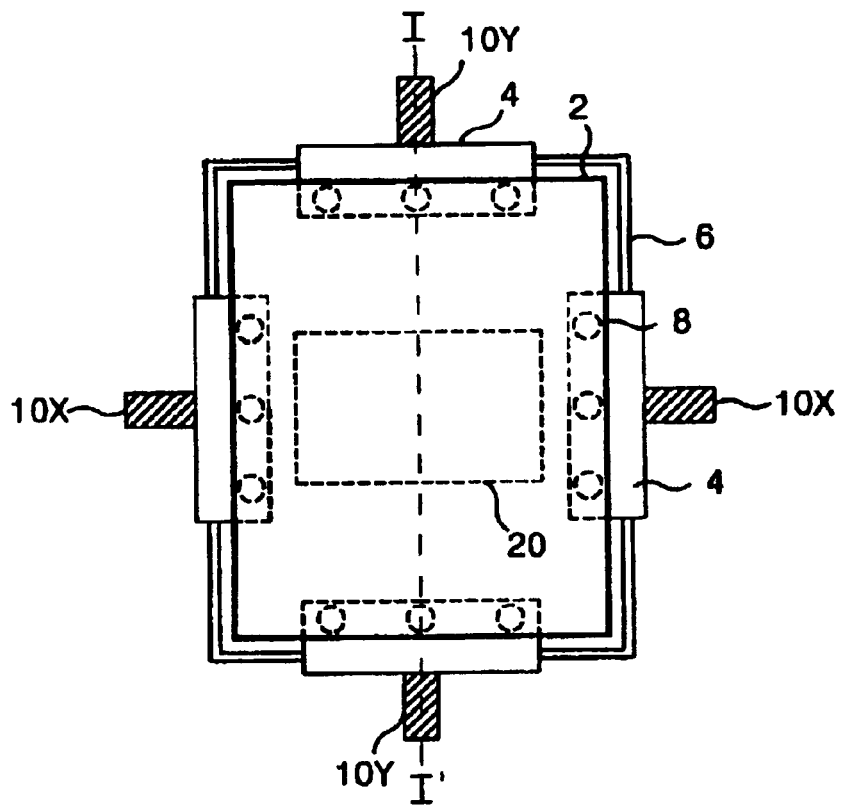
FIG. 1 is a plan view of an exposure device according to the related art.
Figure 2:
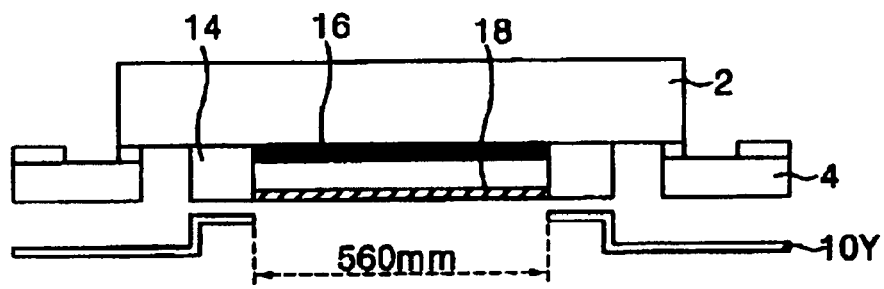
FIG. 2 is a cross sectional view of the exposure device along I–I' of FIG. 1 according to the related art.
Figure 2:
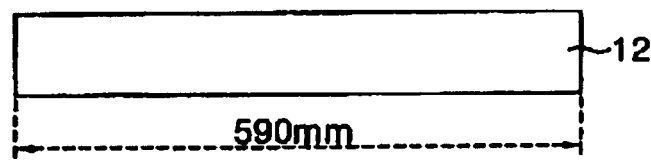
Figure 3:
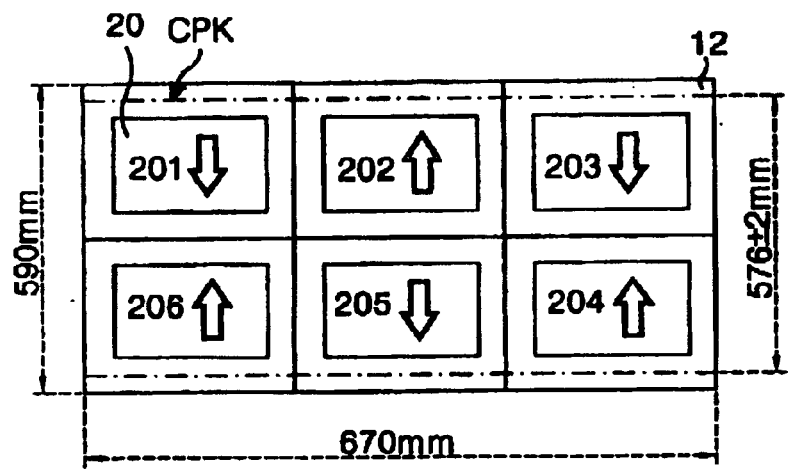
FIG. 3 is a plan view of an exposure order and exposure direction of the substrate of FIG. 2 according to the related art.
Figure 4:
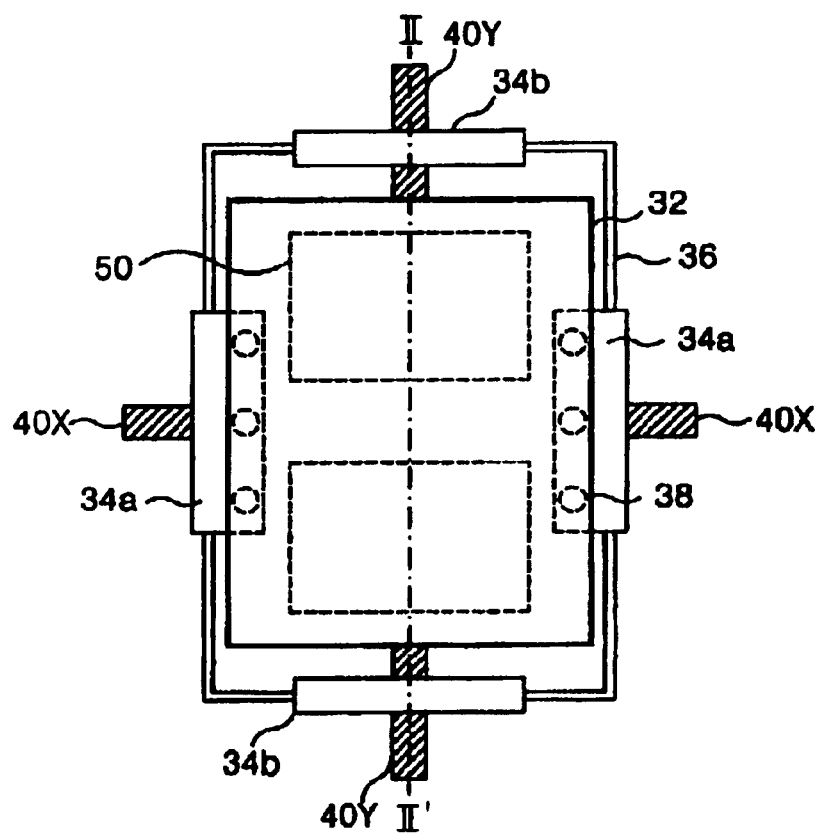
FIG. 4 is a plan view of an exemplary exposure device according to the present invention.
Figure 5:
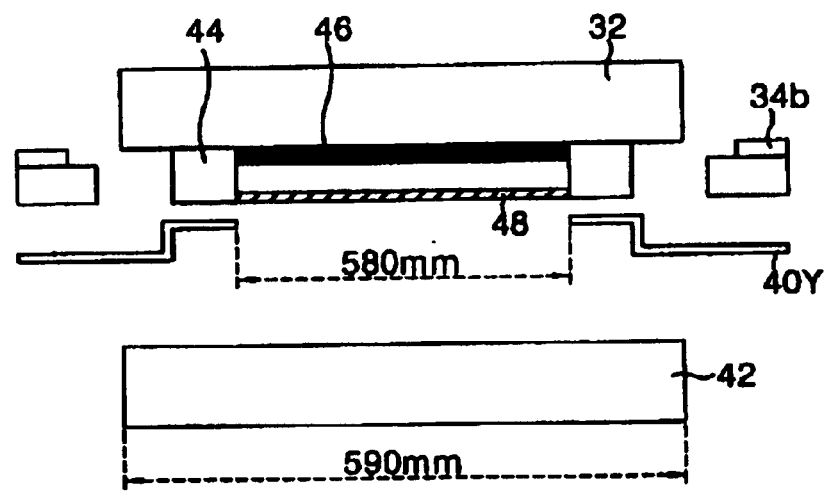
FIG. 5 is a cross sectional view of the exemplary exposure device along II–II' of FIG. 4 according to the present invention.

FIG. 4 is a plan view of an exemplary exposure device according to the present invention, and FIG. 5 is a cross sectional view of the exemplary exposure device along II–II' of FIG. 4 according to the present invention. In FIGS. 4 and 5, a mask stage part of the exemplary exposure device may include a mask 32 having a chrome pattern 46 formed thereon, and first and second vacuum pads 34A and 34B formed at each side of the mask 32. A desired pattern may be formed on the substrate 42 by irradiating light generated from a light irradiator (not shown) onto the mask 32. In addition, a pellicle 48 may be positioned adjacent to the chrome pattern 46 with a specific gap provided therebetween. Alternatively, the pellicle 48 may be formed on the chrome pattern 46. A frame 44 may be formed at both sides of the pellicle 48 for supporting the pellicle 48. In an area distant from the pellicle 48, there may be formed an X-blade 40X and Y-blade 40Y. The X-blade 40X and Y-blade 40Y may formed under the frame 44, and vacuum pads 34a and 34b may be positioned to support the mask 32, thereby preventing light from being transmitted to areas other than the pellicle 48.

Figure 6:
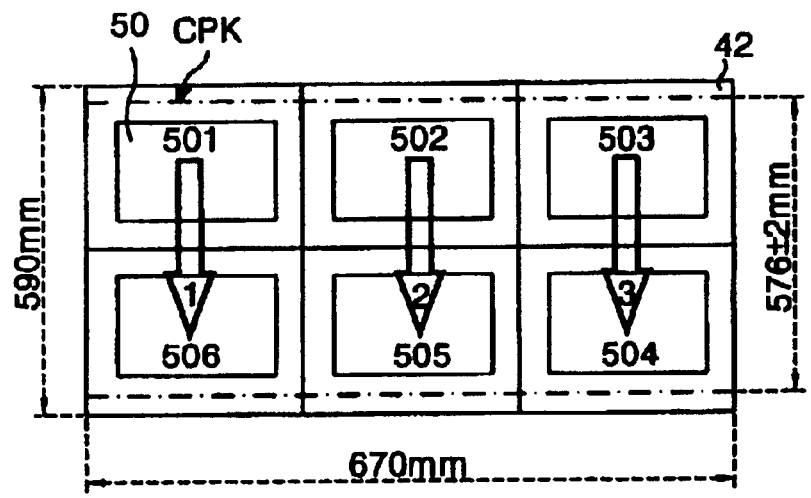
FIG. 6 is a plan view of an exemplary exposure order and exposure direction of the substrate of FIG. 5 according to the present invention.

FIG. 6 is a plan view of an exemplary exposure order and exposure direction of the substrate of FIG. 5 according to the present invention. In FIG. 6, the length of a shorter side of the substrate 42 located under the mask 32 may be about 590 mm, and the length of a longer side of the substrate 42 located under the mask 32 may be about 670 mm. In addition, the pattern formed on the substrate 42 may be within a cell process key CPK that may be about 576±2 mm, and an inspection pattern may be formed along an outer area of the substrate 42 from the CPK. The substrate 42 may include a plurality of liquid crystal panel display areas 501–506. For example, six liquid crystal display areas may be formed on the substrate 42 in a matrix arrangement, wherein two of the liquid crystal display panel areas may be formed to correspond to one mask 32. The longer side surface of the mask 32 may be located adjacent to the shorter side surface of the substrate 42, and the shorter side surface of the mask 32 may be located adjacent to the longer side surface of the substrate 42, as shown in FIG. 4.

In FIGS. 4 and 5, the first and second vacuum pads 34A and 34B may absorb the mask 32 using absorber portions 38 to affix the mask 32 over the substrate 42. The first vacuum pad 34A may be positioned adjacent to the longer side surface of the mask 32, and may overlap the mask 32 by a first distance. The second vacuum pad 34B may be positioned along a same direction in which the mask 32 is scanned. Accordingly, the second vacuum pad 34B may face the shorter side surface of the mask 32 with a second distance formed therebetween without having the second vacuum pad 34B overlap the mask 32. In addition, the first and second vacuum pads 34A and 34B may be interconnected each other through a vacuum line 36.

Alternatively, by removing one of the first and second vacuum pads 34A and 34B, the mask 32 may be supported by the removed vacuum pad. Accordingly, the mask 32 may be supported with only the first vacuum pad 34A by removing the second vacuum pad 34B that is located along a same direction in which the mask 32 is scanned, and the second vacuum pad 34B may face the shorter side surface of the mask 32. Thus, an exposure area of the mask 32 increases to about 580 mm, thereby allowing two adjacent liquid crystal display panel areas to be simultaneously exposed along the same direction as the exposure area. In addition, a required exposure area may be about 576 mm for simultaneously exposing the two adjacent liquid crystal display panel areas, which is within the exposure area of about 580 mm.

In FIG. 6, the first to sixth liquid crystal display panel area 501–506 may be exposed using three scans. For example, the first and sixth liquid crystal display panel areas 501 and 506, the second and fifth liquid crystal display panel areas 502 and 505, and the third and fourth liquid crystal display panel areas 503 and 504 may be scanned and exposed along the same direction. Accordingly, the scanning frequency may be decreased, and a total exposure time may be reduced. In addition, because the two adjacent liquid crystal display panel areas may be simultaneously scanned and exposed, an alignment frequency between the mask 32 and the substrate 42 may be reduced, thereby decreasing an alignment time.

The first to sixth liquid crystal display panel areas 501–506 may all be exposed along the same direction. For example, since the first to sixth liquid crystal display panel areas 501–506 are exposed while the mask stage part moves downwards, a decrease in picture quality may be prevented while the mask stage part moves upwards. Accordingly, since the first to sixth liquid crystal display panel areas 501–506 may be scanned and exposed along the same direction, exposure time may be lengthened. However, the increase in exposure time may be compensated by reducing the scanning frequency.

FIG. 7 is a perspective view of an exemplary liquid crystal display panel fabricated using the exemplary exposure device according to the present invention. In FIG. 7 the liquid crystal display panel area may include a color-filter substrate 62 bonded together with a thin film transistor TFT substrate 52, and a liquid crystal material 54 may be positioned therebetween. The liquid crystal 54 rotates in response to application of an electric field, thereby controlling transmittance of incident light via the TFT substrate 52.

The color filter substrate 62 may include a color filter 58 and a common electrode 60 formed on a rear surface of the upper substrate 56. The color filter 58 may include a color filter layer of red (R), green (G), and blue (B) arranged to transmit light of a specific wavelength range, thereby displaying color images. A black matrix (not shown) may be formed between adjacent color filters 58 to absorb the incident light from adjacent cells, thereby preventing deterioration of image contrast.

The TFT substrate 52 may include a data line 70 and a gate line 72 formed on the entire surface of a lower substrate 66, wherein the data and gate lines 70 and 72 cross each other. A TFT 76 may be positioned at each of the intersections of the data and gate lines 70 and 72. The TFT 76 may include a gate electrode connected to the gate line 72, a source electrode connected to the data line 70, and a drain electrode connected to a pixel electrode 74 through a contact hole. The TFT 76 responds to the gate signal transmitted along the gate line 72 to selectively supply a data signal transmitted along the data line 70 to the pixel electrode 74.

The pixel electrode 74 may be positioned within a cell area that is divided by the data line 70 and the gate line 72. The pixel electrode 74 may be formed of a transparent conductive material having high light transmittance. Together the pixel electrode 74 and the data signal transmitted on the data line 70 generate a potential difference with the common electrode 60 formed on the upper substrate 56. Due to the potential difference, the liquid crystal molecules of the liquid crystal material 54 positioned between the lower substrate 66 and the upper substrate 56 rotate due to dielectric constant anisotropy of the liquid crystal molecules. Accordingly, light supplied via the pixel electrode 74 from a light source may be transmitted toward the upper substrate 56.

An exemplary fabricating process of the liquid crystal display panel according to the present invention may be divided into a cleaning process for cleaning the upper and lower substrates 56 and 66, a patterning process for patterning the upper and lower substrates 56 and 66, an alignment film forming process for forming an alignment film on one or both of the upper and lower substrates 56 and 66, a bonding process for bonding the upper and lower substrates 56 and 66, a liquid crystal material forming process for positioning the liquid crystal material between the upper and lower substrates 56 and 66, and mounting and testing processes.

During the cleaning process, the upper and lower substrates 56 and 66 may be cleaned to remove impurities from the upper and lower substrates 56 and 66 using detergent both before and after the patterning process. During the patterning process, a black matrix may be deposited on the upper substrate 56 and subsequently patterned. Next, a color filter 58 and a common electrode 60 may be formed on the upper substrate 56 using a deposition process. Alternatively, a printing process and photolithographic process may be used that include an exposing process and an etching process. Next, a gate line 72, a thin film transistor 76, a data line 70, and a pixel electrode 74 may be formed on the lower substrate 66. The gate line 72, a thin film transistor 76, a data line 70, and a pixel electrode 74 may be formed using a deposition process. Alternatively, a printing process and photolithographic process may be used that include an exposing process and an etching process.

During the alignment film forming process, an alignment film may be formed on one or both of the upper and lower substrates 56 and 66. The alignment film may be formed using a deposition process. Alternatively, the alignment film may be formed using a printing process and photolithographic process that include an exposing process and an etching process. Once the alignment film has been formed, an alignment process may be performed, wherein the alignment film may be rubbed.

During the bonding process, the upper and lower substrates 56 and 66 may be bonded together. Next, during the liquid crystal material forming process, the liquid crystal material may be injected between the upper and lower substrates 56 and 66 through an injection hole formed in a sealant layer between the upper and lower substrates 56 and 66.

Finally, during the mounting and testing processes, a Tape Carrier Package TCP that may include an integrated circuit IC, such as a gate drive IC and a data drive IC (not shown), may be mounted and connected to a pad of a signal line formed on the lower substrate 66.

It will be apparent to those skilled in the art that various modifications and variations can be made in the exposure device and method of fabricating liquid crystal display panel using the exposure device of the present invention without departing from the spirit or scope of the invention. Thus, it is intended that that present invention cover the modifications and variations of this invention provided they come within the scope of the appended claims and their equivalents.

What is claimed is:

1. An exposure device, comprising:
   a light irradiator for irradiating light;
   a mask having a pattern to be formed on a substrate, the mask having a pair of long sides extending along a first direction and a pair of shorter sides extending along a second direction such that the mask has a size larger than at least two display panel areas positioned on the substrate; and
   a first pair of vacuum pads positioned along and overlapping the long sides of the mask for affixing the mask over the substrate and a second pair of vacuum pads positioned along and spaced apart from the short sides of the mask.

2. The device according to claim 1, further including first and second shielding blades for preventing portions of the substrate from being exposed to the irradiated light.

3. The device according to claim 1, wherein a length of a shorter side of the substrate is about 590 mm, and a length of a longer side of the substrate is about 670 mm.

4. The device according to claim 1, wherein a side of an exposure area of the mask is about 580 mm.

5. The device according to claim 1, wherein a shorter side of the substrate and the longer sides of the mask are parallel with each other.

6. The device according to claim 1, wherein the first and second pairs of vacuum pads are connected to each other through a vacuum line.

7. The device according to claim 1, wherein the first pair of vacuum pads face each other along the longer sides of the mask.

8. The device according to claim 1, wherein the second pair of vacuum pads face each other along the second direction perpendicular to an exposure direction.

9. A method of fabricating a liquid crystal display panel using an exposure device, comprising:
   providing a substrate having at least two adjacent display panel areas;
   positioning a mask over the substrate using a first pair of vacuum pads positioned along and overlapping long sides of the mask for affixing the mask over the substrate and a second pair of vacuum pads positioned along and spaced apart from short sides of the mask; and
   forming a pattern simultaneously on the two adjacent display panel areas along an exposure direction of the exposure device.

10. The method according to claim 9, wherein a length of a shorter side of the substrate is about 590 mm, and a length of a longer side of the substrate is about 670 mm.

11. The method according to claim 9, wherein a side of an exposure area of the mask is about 580 mm.

12. The method according to claim 11, wherein the side of the exposure area is larger than a length of at least two adjacent display panel areas.

13. The method according to claim 9, wherein a shorter side of the substrate and the long sides of the mask are parallel with each other.

14. The method according to claim 9, wherein the second pair of vacuum pads face each other along a first direction perpendicular to the exposure direction.

* * * * *